United States Patent
Disney et al.

(10) Patent No.: US 8,686,503 B2
(45) Date of Patent: Apr. 1, 2014

(54) LATERAL HIGH-VOLTAGE TRANSISTOR AND ASSOCIATED METHOD FOR MANUFACTURING

(75) Inventors: Donald R. Disney, Cupertino, CA (US); Ognjen Milic, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 252 days.

(21) Appl. No.: 13/212,097

(22) Filed: Aug. 17, 2011

(65) Prior Publication Data
US 2013/0043532 A1 Feb. 21, 2013

(51) Int. Cl.
*H01L 29/66* (2006.01)
(52) U.S. Cl.
USPC ............ 257/339; 257/E29.261; 257/E21.417; 438/286
(58) Field of Classification Search
None
See application file for complete search history.

(56) References Cited

U.S. PATENT DOCUMENTS

| | | | | |
|---|---|---|---|---|
| 6,680,515 | B1 * | 1/2004 | Hsing | 257/409 |
| 8,324,684 | B1 * | 12/2012 | Pernyeszi | 257/337 |
| 2010/0096697 | A1 * | 4/2010 | Su et al. | 257/343 |
| 2010/0301414 | A1 | 12/2010 | Yoo | |
| 2011/0062554 | A1 | 3/2011 | Hsing et al. | |

* cited by examiner

*Primary Examiner* — Fei Fei Yeung Lopez
(74) *Attorney, Agent, or Firm* — Perkins Coie LLP

(57) ABSTRACT

The present disclosure discloses a lateral high-voltage transistor and associated method for making the same. The lateral high-voltage transistor comprises a semiconductor layer of a first conductivity type; a source region of a second conductivity type opposite to the first conductivity type in the semiconductor layer; a drain region of the second conductivity type in the semiconductor layer separated from the source region; a first isolation layer atop the semiconductor layer between the source region and the drain region; a first well region of the second conductivity type surrounding the drain region, extending towards the source region and separated from the source region; a second well region of the first conductivity type surrounding the source region; a gate positioned atop the first isolation layer above the second well region and an adjacent portion of the first well region; and a first buried layer of the first conductivity type under the first well region adjacent to the source region side of the lateral high-voltage transistor. A JFET is formed using the gate as a JFET top gate and the first buried layer as a JFET bottom gate.

17 Claims, 4 Drawing Sheets

LATERAL HIGH-VOLTAGE TRANSISTOR AND ASSOCIATED METHOD FOR MANUFACTURING

TECHNICAL FIELD

This disclosure relates generally to semiconductor devices, and particularly relates to lateral high-voltage transistors.

BACKGROUND

Lateral high-voltage transistors are commonly used in power management applications, such as power supplies for industrial and consumer electronic devices. A lateral high-voltage transistor used in such power management applications may be switched ON or OFF in response to control signals to convert a supply voltage into an output voltage which is suitable to power industrial and consumer electronic devices. In most high-voltage power management applications, of which the supply voltage may be as high as 1000V, it is desired that the lateral high-voltage transistor have a high breakdown voltage as well as a low on-resistance to ensure operation security and to improve the efficiency of power conversion.

Most existing lateral high-voltage transistors comprise a source region and a body region that are connected together to provide good ruggedness or safe-operating area ("SOA") by suppressing the effect of a parasitic bipolar transistor, wherein the body region is connected to a substrate. Thus, the source region shares the same potential as the substrate. However, in some power management applications, a lateral high-voltage transistor having a source region that could assume a higher voltage than the substrate (typically connected to ground) is desired. Meanwhile, the lateral high-voltage transistor should still exhibit good capability of withstanding high-voltage without damage (i.e. should have a high-breakdown voltage) and good current carrying performance (i.e. should have a low on-resistance).

One way to allow the source region to assume higher voltage than the substrate is to separate the source region and the body region (do not connect them together), such that the body region is still connected to the substrate, but the source region can assume a voltage "floating" above the substrate voltage. However, in this case, the maximum source voltage is limited to the breakdown voltage between the source region and the body region, which is typically only about 10V. A further limitation of this approach is the degradation of the SOA because a base resistance of the parasitic bipolar transistor is increased due to increased distance from the source region to the body region.

SUMMARY

In one embodiment, a lateral high-voltage transistor comprises a semiconductor layer of a first conductivity type; a source region of a second conductivity type opposite to the first conductivity type in the semiconductor layer; a drain region of the second conductivity type in the semiconductor layer separated from the source region; a first isolation layer atop the semiconductor layer between the source region and the drain region; a first well region of the second conductivity type surrounding the drain region, extending towards the source region and separated from the source region; a second well region of the first conductivity type surrounding the source region; a gate positioned atop the first isolation layer above the second well region and an adjacent portion of the first well region; and a first buried layer of the first conductivity type under the first well region near the source region side of the lateral high-voltage transistor.

In one embodiment, the lateral high-voltage transistor further comprises a body contact region of the first conductivity type in the second well region adjacent to the source region.

In one embodiment, the lateral high-voltage transistor further comprises a second buried layer of the second conductivity type under the second well region, wherein the second buried layer is coupled to the first well region.

In one embodiment, a method of forming a lateral high-voltage transistor comprises: providing a semiconductor layer of a first conductivity type; forming a first buried layer of the first conductivity type in the semiconductor layer; forming a first well region of a second conductivity type opposite to the first conductivity type in the semiconductor layer, wherein the first well region has a bottom contacting the first buried layer near an edge of the first well region; forming a second well region of the first conductivity type in the semiconductor layer, wherein an edge of the second well region is adjacent to the edge of the first well region near the first buried layer; forming a drain region of the second conductivity type in the first well region; forming a source region of the second conductivity type in the second well region; forming a first isolation layer atop the semiconductor layer between the source region and the drain region; and forming a gate atop the first isolation layer above the second well region and an adjacent portion of the first well region.

In one embodiment, the method of forming the lateral high-voltage transistor further comprises forming a body contact region of the first conductivity type adjacent to the source region.

In one embodiment, the method of forming the lateral high-voltage transistor further comprises forming a second buried layer of the second conductivity type adjacent to the first buried layer in the semiconductor layer, wherein the second buried layer is under the second well region, and wherein the second buried layer is coupled to the first well region.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," right," "in," "out," "front," "back," "up," "down, "top," "atop", "bottom," "over," "under," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Those skilled in the art should understand that the meanings of the terms identified above do not necessarily limit the terms, but merely provide illustrative examples for the terms.

Figure 1:
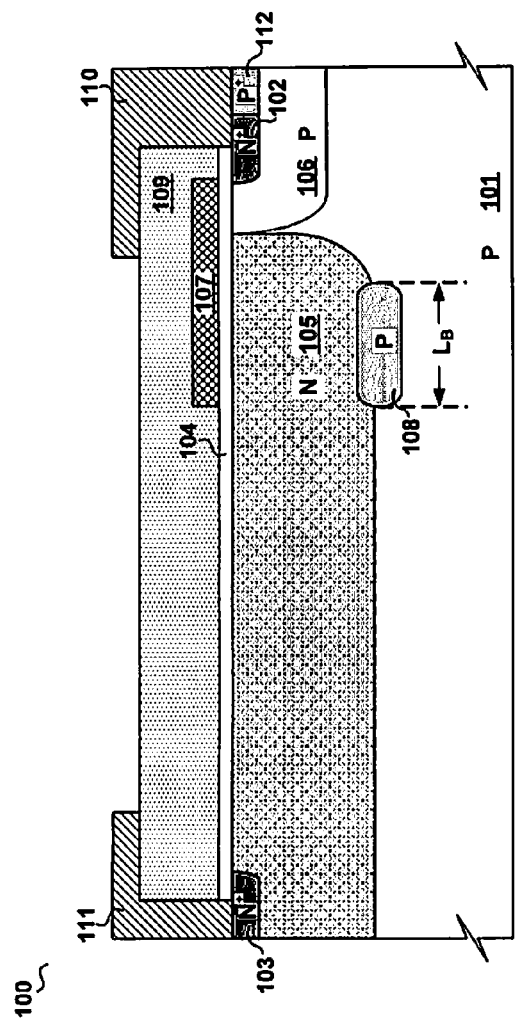
FIG. 1 illustrates a sectional view of a lateral high-voltage transistor 100 in accordance with an embodiment of the present invention.

FIG. 1 illustrates schematically a sectional view of a lateral high-voltage transistor 100 in accordance with an embodiment of the present invention. The lateral high-voltage transistor 100 comprises a semiconductor layer 101 of a first conductivity type (e.g. P-type in FIG. 1); a source region 102 of a second conductivity type (e.g. N-type in FIG. 1) opposite to the first conductivity type in the semiconductor layer 101, wherein the source region 102 may have a heavy dopant concentration, for example, higher than $1 \times 10^{19}$ cm$^{-3}$; a drain region 103 of the second conductivity type (e.g. an N$^+$ region in FIG. 1) in the semiconductor layer 101 separated from the source region 102, wherein the drain region 103 may have a heavy dopant concentration, for example, higher than $1 \times 10^{19}$ cm$^{-3}$; a first isolation layer 104 atop the semiconductor layer 101 between the source region 102 and the drain region 103; a first well region 105 of the second conductivity type surrounding the drain region 103, extending towards the source region 102 and separated from the source region 102; a second well region 106 of the first conductivity type (e.g. a P-type body region in FIG. 1) surrounding the source region 102; a gate 107 positioned atop the first isolation layer above the second well region 106 and an adjacent portion of the first well region 105; and a first buried layer 108 of the first conductivity type (e.g. a P-type buried layer in FIG. 1) under the first well region 105 adjacent to the source region side of the lateral high-voltage transistor 100.

In one embodiment, the lateral high-voltage transistor 100 may further comprise a first dielectric layer 109 covering the first isolation layer 104 and the gate 107; a source electrode 110 coupled to the source region 102; a drain electrode 111 coupled to the drain region 103; and a gate electrode (not shown in FIG. 1) coupled to the gate 107.

In one embodiment, the first isolation layer 104 may comprise silicon dioxide. In other embodiment, the first isolation layer 104 may comprise other isolation materials that are compatible with other aspects of the device manufacturing process.

In one embodiment, the gate 107 may comprise doped poly-silicon. In other embodiment, the gate 107 may comprise other conductive materials (e.g., metals, other semiconductors, semi-metals, and/or combinations thereof) that are compatible with other aspects of the device manufacturing process. Thus, the term "poly-silicon" is intended to include such other materials and material combinations in addition to silicon.

In one embodiment, the lateral high-voltage transistor 100 may further comprise a body contact region 112 of the first conductivity type with a heavy dopant concentration (e.g. a P$^+$ body contact region in FIG. 1) adjacent to the source region 102. The body contact region 112 may be connected to the source region 102 and coupled to the source electrode 110, as shown in FIG. 1. In other embodiments, the lateral high-voltage transistor 100 may further comprise a body electrode (not shown in FIG. 1) separated from the source electrode 110, wherein the body contact region 112 is separated from the source region 102 and is coupled to the body electrode instead of the source electrode 110, such that the source region 102 can assume a voltage higher than that of the body contact region 112 (i.e. the source region 102 can assume a voltage higher than that of the semiconductor layer 101).

In accordance with the embodiment shown in FIG. 1, a junction field effect transistor ("JFET") is formed using the gate 107 as a JFET top gate and the first buried layer 108 as a JFET bottom gate. The JFET has a pinch-off voltage at which a portion of the first well region 105 between the gate 107 and the first buried layer 108 is fully depleted by the overlying gate 107 and by the underlying first buried layer 108 when a voltage applied to the drain region 103 exceeds the pinch-off voltage. The pinch-off voltage may depend on a dopant concentration and a thickness of the first well region 105 between the top surface of the first well region 105 and the first buried layer 108, a length $L_B$ of the first buried layer 108, a first bias voltage applied to the JEFT top gate (the gate 107), and a second bias voltage applied to the JFET bottom gate (the first buried layer 108). For example, if the first well region 105 of the lateral high-voltage transistor 100 has a dopant concentration of about $1 \times 10^{12}$ cm$^{-3}$ to $2 \times 10^{12}$ cm$^{-3}$, and a thickness of about 3 μm to 6 μm, and the first buried layer 108 has a length $L_B$ of about 2 μm to 6 μm, the JFET may have a pinch-off voltage of about 10V to 40V. Those skilled in the art should understand that, in various practical applications, the factors (e.g. the dopant concentration and the thickness of the first well region 105 between the top surface of the first well region 105 and the first buried layer 108, the length $L_B$ of the first buried layer 108, the first bias voltage applied to the JEFT top gate, and the second bias voltage applied to the JFET bottom gate etc.) which determine the JFET pinch-off voltage can be modified by users to make the JFET pinch-off voltage at a desired value.

In the exemplary embodiment shown in FIG. 1, the pinch-off voltage of the JFET may be designed to be lower than a breakdown voltage of the junction formed by the first well region 105 and the second well region 106. As illustrated in FIG. 1, the JFET bottom gate (the first buried layer 108) is electrically connected to the semiconductor layer 101, and thus the second bias voltage applied to the JFET bottom gate shares the same voltage applied to the semiconductor layer 101 (typically having a ground potential). When the lateral high-voltage transistor 100 is in an OFF state, the first bias voltage applied to the JFET top gate (the gate 107) may be near ground potential, the pinch-off voltage of the JFET may have a lowest pinch-off value.

During the OFF state of the lateral high-voltage transistor 100, when a voltage is applied to the drain electrode 111 (i.e. to the drain region 103), the junction formed by the first well region 105 and the second well region 106 may assume a voltage following the voltage applied to the drain region 103. However, when the voltage applied to the drain region 103 is increased to a certain value that exceeds the JFET pinch-off voltage, the JFET is pinched off, the voltage assumed by the junction formed by the first well region 105 and the second well region 106 stops following the voltage applied to the drain region 103, and further increases of the voltage applied to the drain region 103 are supported by the first well region 105 between the drain region 103 and the left side of the JFET, limiting the voltage assumed by the junction formed by the first well region 105 and the second well region 106 lower than the junction breakdown voltage. Therefore, the lateral high-voltage transistor 100 may have an increased breakdown voltage while still maintaining a low on-resistance.

It should be understood by those skilled in the art that the factors (e.g. the dopant concentration and the thickness of the first well region 105 between the top surface of the first well region 105 and the first buried layer 108, the length $L_B$ of the first buried layer 108, the first bias voltage applied to the JEFT top gate, and the second bias voltage applied to the JFET bottom gate etc.) which determine the JFET pinch-off voltage should be carefully chosen so that a portion of the first well region 105 between the JFET top gate (the gate 107) and the JFET bottom gate (the first buried layer 108) can be fully depleted by the JFET top gate and the JFET bottom gate when the voltage applied on the drain region 103 exceeds the pinch-off voltage of the JFET.

During an ON state of the lateral high-voltage transistor 100, the voltage applied to the drain region 103 may be at a certain high value, such as 400V, and the first bias voltage applied to the gate 107 (the JFET top gate) is raised from close to ground potential to a desired level, such as 40V, resulting in the pinch-off voltage of the JFET being increased. In this case, the voltage assumed by the source region 102 may follow the first bias voltage applied to the gate 107 until the JFET is pinched OFF, allowing the voltage of the source region 102 to follow the first bias voltage applied to the gate 107 up to values much higher than the pinch-off voltage of the JFET in OFF state (i.e. the lowest pinch-off value of the JFET).

In one embodiment, the gate 107 may extend laterally to overlie a substantial portion of the first buried layer 108. In this case, the extended gate 107 (the JFET top gate) may serve to enhance the capability of capacitively coupling for controlling the pinch-off voltage of the JFET.

Figure 2:
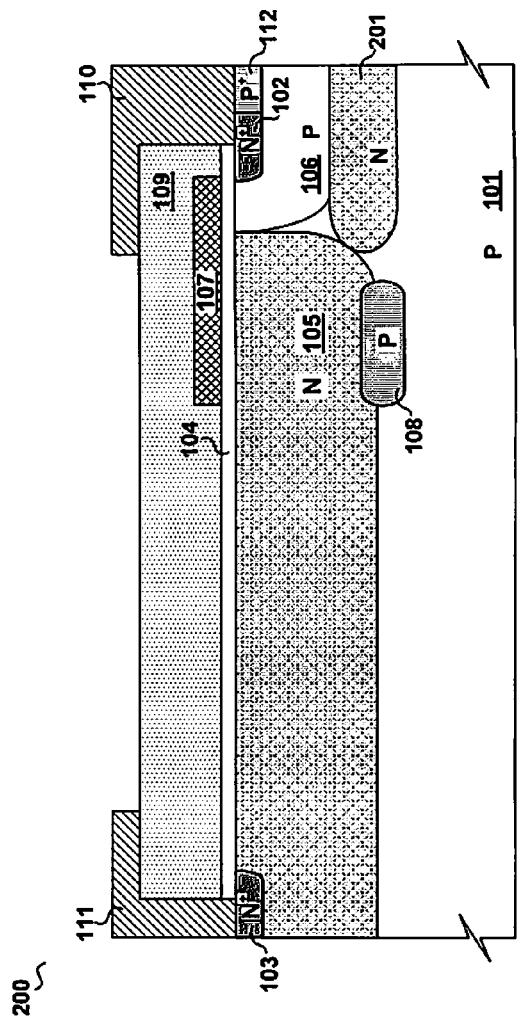
FIG. 2 illustrates a sectional view of a lateral high-voltage transistor 200 in accordance with another embodiment of the present invention.

FIG. 2 illustrates schematically a sectional view of a lateral high-voltage transistor 200 in accordance with another embodiment of the present invention. Components or structures in the lateral high-voltage transistor 200 with substantially the same functions as those of the lateral high-voltage transistor 100 are identified by the same reference labels as used in the lateral high-voltage transistor 100 for the sake of simplicity. As illustrated in FIG. 2, the lateral high-voltage transistor 200 may further comprise a second buried layer 201 of the second conductivity type (e.g. an N-type buried layer in FIG. 2) under the second well region 106, wherein the second buried layer 201 is coupled to the first well region 105. The second buried layer 201 and the first well region 105 electrically isolates the second well region 106 from the semiconductor layer 101. Therefore, the source region 102 and the second well region 106 of the lateral high-voltage transistor 200 may assume a higher voltage than the semiconductor layer 101 (i.e. the source region 102 and the body region 107 can assume a voltage "floating" above a voltage of the semiconductor layer 101).

In the exemplary embodiment shown in FIG. 2, the pinch-off voltage of the JFET may be designed to be lower than a breakdown voltage of the junction formed by the second buried layer 201 and the second well region 106. During an OFF state of the lateral high-voltage transistor 200, when a voltage is applied to the drain electrode 111 (i.e. to the drain region 103), the second buried layer 201 may assume a voltage following the voltage applied to the drain region 103. However, when the voltage applied to the drain region 103 is increased to a certain value such that the JFET is pinched off, the voltage assumed by the second buried layer 201 stops following the voltage applied to the drain region 103, and further increases of the voltage applied to the drain region 103 are supported by the first well region 105 between the drain region 103 and the left side of the JFET, limiting the voltage assumed by the second buried layer 201 lower than the breakdown voltage of the junction formed by the second buried layer 201 and the second well region 106. Therefore, the lateral high-voltage transistor 200 may have an increased breakdown voltage, and meanwhile the source region 102 and the second well region 106 may be able to assume a voltage higher than a voltage of the semiconductor layer 101.

Figure 3:
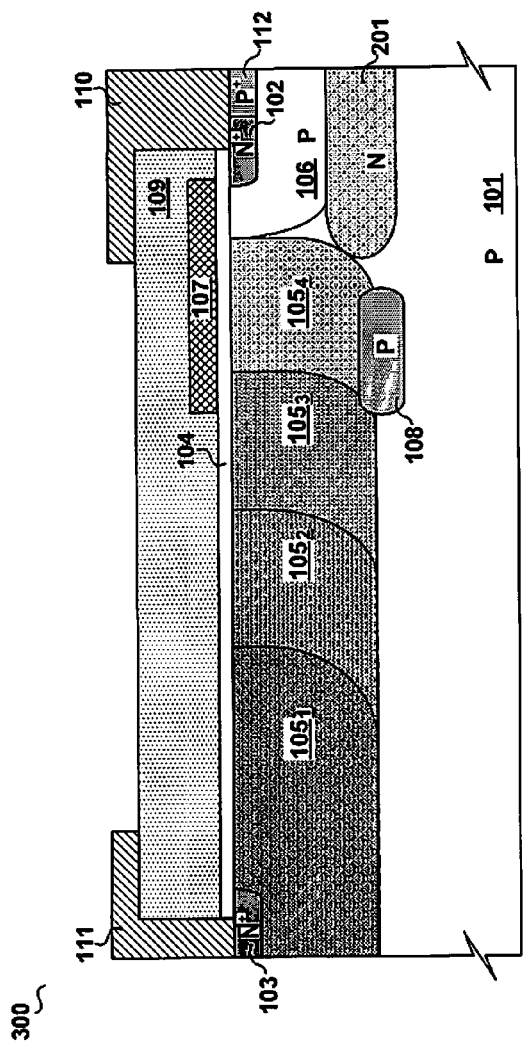
FIG. 3 illustrates a sectional view of a lateral high-voltage transistor 300 in accordance with another embodiment of the present invention.

FIG. 3 illustrates schematically a sectional view of a lateral high-voltage transistor 300 in accordance with another embodiment of the present invention. Components or structures in the lateral high-voltage transistor 300 with substantially the same functions as those of the lateral high-voltage transistors 100 and 200 are identified by the same reference labels as used in the lateral high-voltage transistors 100 and 200 for the sake of simplicity. As illustrated in FIG. 3, the first well region 105 of the lateral high-voltage transistor 300 may comprise a plurality of second-conductivity-type dopant zones wherein each second-conductivity-type dopant zone has a different dopant concentration from the other second-conductivity-type dopant zones. In one embodiment, the plurality of second-conductivity-type dopant zones may have degrading dopant concentrations in the direction from the dopant zone immediately surrounding the drain region 103 to the dopant zone farthest from the drain region 103. For example, the dopant zone closest to the drain region 103 may have a dopant concentration lighter than that of the drain region 103, the dopant zone furthest from the drain region may have a dopant concentration lighter than that of the dopant zone closer to the drain region 103. In this case, the lateral high-voltage transistor 300 may have a further decreased on-resistance without decreasing the breakdown voltage, because the first well region 105 is doped lighter near the source region 102, reducing the possibility of breakdown near the source region 102.

It should be understand by those skilled in the art that the dopant concentration of the dopant zone(s) that is/are above the first buried layer 108 is an important factor in determining the pinch-off voltage of the JFET. Thus, the dopant concentration of the dopant zone(s) that is/are above the first buried layer 108 should be carefully chosen so that a portion of the first well region 105 between the JFET top gate (the gate 107) and the JFET bottom gate (the first buried layer 108) can be fully depleted by the JFET top gate and the JFET bottom gate when a voltage on the drain region 103 exceeds the pinch-off voltage of the JFET. The dopant concentrations of the other dopant zones may be higher to lower the on-resistance of the lateral high-voltage transistor 300, without substantially affecting the JFET pinch-off voltage. In the exemplary embodiment shown in FIG. 3, the first well region 105 is illustrated as to comprise four second-conductivity-type dopant zones $105_1$~$105_4$, while the drain region 103 is heavy doped with a dopant concentration greater than $1\times10^{19}$ cm$^{-3}$, the second-conductivity-type dopant zone $105_1$ immediately surrounding the drain region 103 is doped with a dopant concentration of about $4\times10^{12}$ cm$^{-3}$, the second-conductivity-type dopant zones $105_2$, $105_3$ and $105_4$ are respectively doped with a dopant concentration of about $3\times10^{12}$ cm$^{-3}$, $2\times10^{12}$ cm$^{-3}$ and $1\times10^{12}$ cm$^{-3}$. It can be appreciated by those of ordinary skill in the art that the number of the second-conductivity-type dopant zones, the doping concentration of each second-conductivity-type dopant zone, and the width of each second-conductivity-type dopant zone may be modified as required to optimize the performance of the lateral high-voltage transistor 300.

Figure 4:
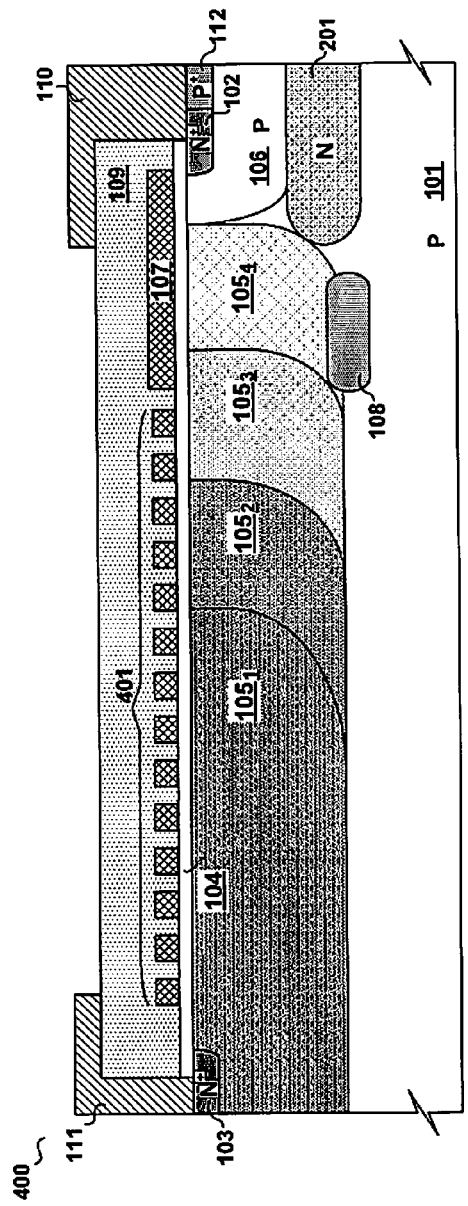
FIG. 4 illustrates a sectional view of a lateral high-voltage transistor 400 in accordance with another embodiment of the present invention.

FIG. 4 illustrates schematically a sectional view of a lateral high-voltage transistor 400 in accordance with another embodiment of the present invention. Components or structures in the lateral high-voltage transistor 400 with substantially the same functions as those of the lateral high-voltage transistors 100, 200 and 300 are identified by the same reference labels as used in the lateral high-voltage transistors 100, 200 and 300 for the sake of simplicity. The lateral high-voltage transistor 400 may further comprise a spiral resistive field plate 401 atop the first isolation layer 104 between the drain region 103 and the gate 107, wherein the spiral resistive field plate 401 comprises a first end coupled to the source region 102 and a second end coupled to the drain region 103. In an exemplary embodiment, the first end of the spiral resistive field plate 401 may be coupled to the source region 102 via the source electrode 110, and the second end of the spiral resistive field plate 401 may be coupled to the drain region via the drain electrode 111.

In one embodiment, the spiral resistive field plate 401 may comprise a long and narrow resistor formed by medium to high resistivity polysilicon and arranged as a spiral between the drain region 103 and the gate 107. The width of each segment of the spiral resistive field plate 401 may be about 0.4 µm to 1.2 µm, and the space between each segment may be about 0.4 µm to 1.2 µm. In other embodiments, the spiral resistive field plate 401 may be implemented by any other conventional methods.

According to the embodiment shown in FIG. 4, the spiral resistive field plate 401 may act as a large resistor coupled between the drain region 103 and the source region 102, allowing only a very small leakage current to flow from the drain region 103 to the source region 102 of the lateral high-voltage transistor 400 when the lateral high-voltage transistor 400 is in an OFF state and a high voltage is applied on the drain electrode 111. In addition, when a high voltage is applied on the drain electrode 111, the spiral resistive field plate 401 may help to establish a linear voltage distribution along the surface of the first well region 105 between the drain region 103 and the source region 102. The linear voltage distribution may provide a uniform electric field distribution in the first well region 105, alleviating the formation of high electric field locations in the first well region 105, improving the breakdown voltage of the lateral high-voltage transistor 400. Moreover, the spiral resistive field plate 401 may help to deplete the first well region 105. In that case, the first well region 105 may have a higher dopant concentration than would be possible without the spiral resistive field plate 401, allowing the lateral high-voltage transistor 400 have a reduced on-resistance without lowering the breakdown voltage.

In other embodiments, the first end of the spiral resistive field plate 401 may be coupled to the gate 107 or to the body contact region 112 instead of being coupled to the source region 102.

Figure 5:
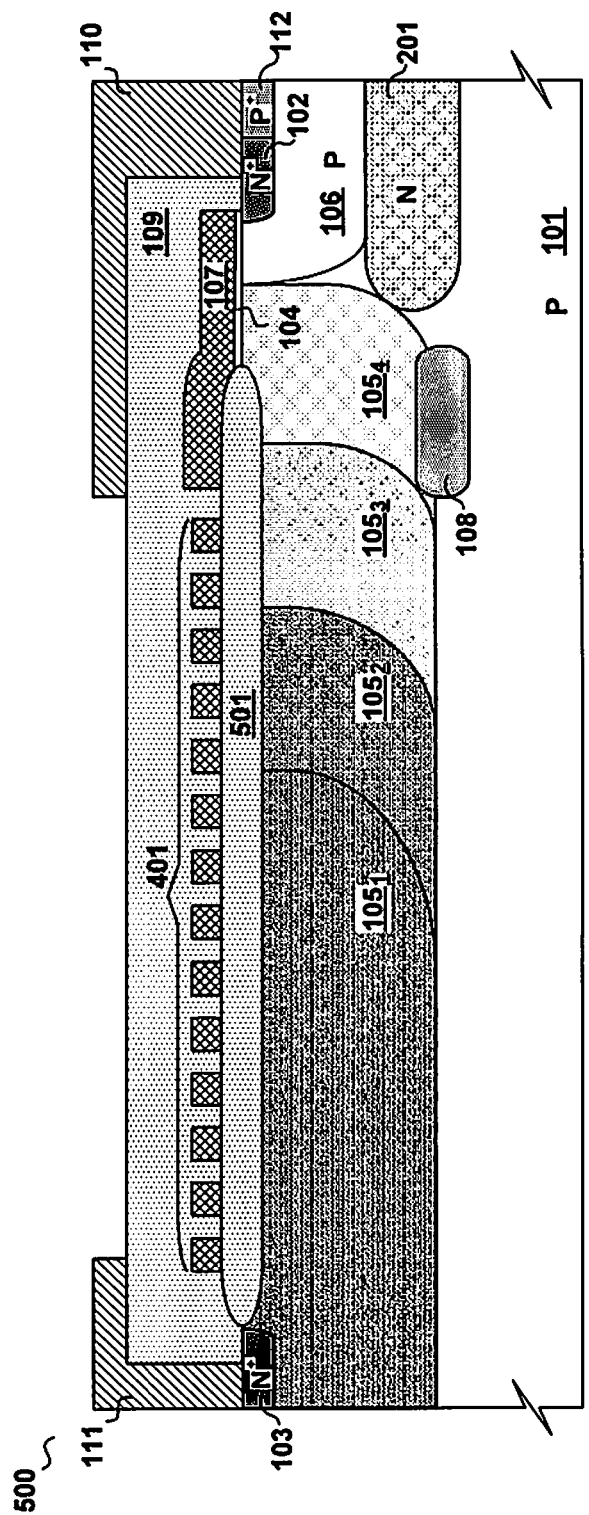
FIG. 5 illustrates a sectional view of a lateral high-voltage transistor 500 in accordance with another embodiment of the present invention.

FIG. 5 illustrates schematically a sectional view of a lateral high-voltage transistor 500 in accordance with another embodiment of the present invention. Components or structures in the lateral high-voltage transistor 500 with substantially the same functions as those of the lateral high-voltage transistors 100, 200, 300 and 400 are identified by the same reference labels as used in the lateral high-voltage transistors 100, 200, 300 and 400 for the sake of simplicity. As illustrated in FIG. 5, the lateral high-voltage transistor 500 may further comprise a thick dielectric layer 501 (e.g. a thick field oxide layer) over a portion of the first well region 105 to laterally isolate the drain region 103 from the gate 107 and the source region 102, wherein the gate 107 may have a portion extending on top of the thick dielectric layer 501 over the first buried layer 108. In one embodiment, the thick dielectric layer 501 may also comprise silicon dioxide. In one embodiment, the lateral high-voltage transistor 500 may further comprise the spiral resistive field plate 401, wherein the spiral resistive field plate 401 is atop the thick dielectric layer 501 instead of the first isolation layer 104.

The advantages of the various embodiments of the present invention are not confined to those described above. These and other advantages of the various embodiments of the present invention will become more apparent upon reading the whole detailed descriptions and studying the various figures of the drawings.

Figure 6:
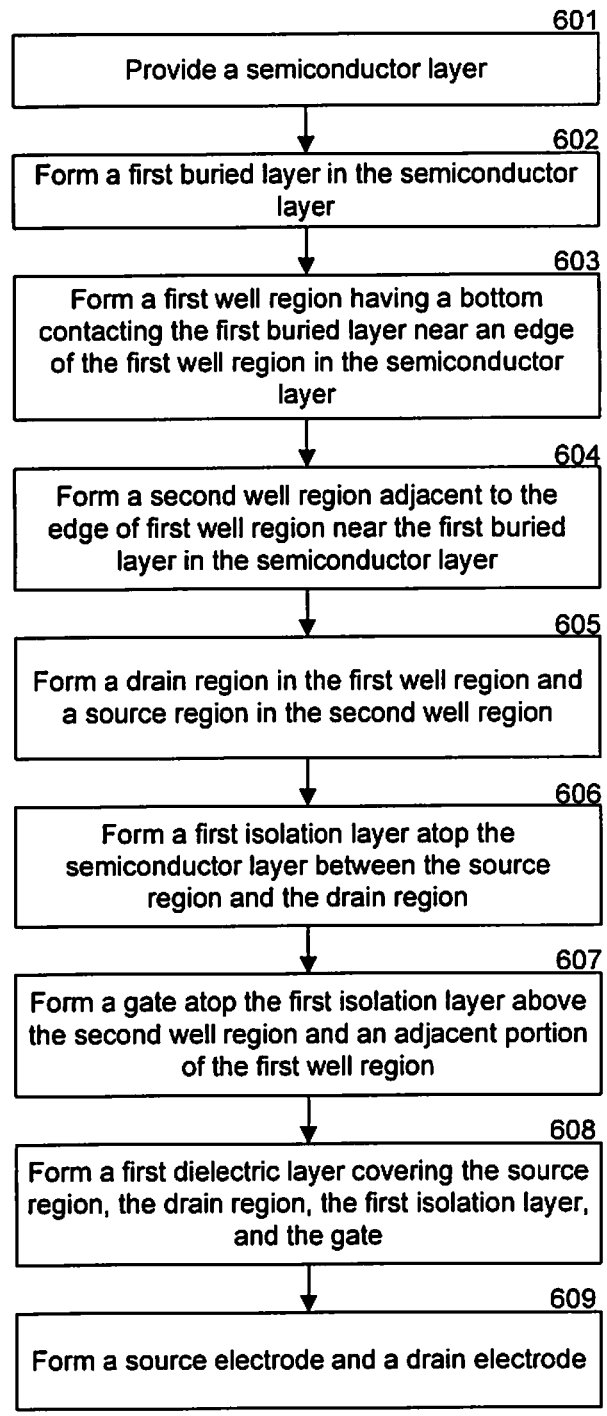
FIG. 6 shows a flow chart illustrating a method of forming a high-voltage transistor in accordance with an embodiment of the present invention.

FIG. 6 shows a flow chart illustrating a method of forming a lateral high-voltage transistor in accordance with an embodiment of the present invention. The method comprises: providing a semiconductor layer of a first conductivity type at step 601; forming a first buried layer of the first conductivity type in the semiconductor layer at step 602; forming a first well region of a second conductivity type opposite to the first conductivity type in the semiconductor layer at step 603, wherein the first well region has a bottom contacting the first buried layer adjacent to an edge of the first well region; forming a second well region of the first conductivity type in the semiconductor layer at step 604, wherein an edge of the second well region is adjacent to the edge of the first well region near the first buried layer; forming a drain region of the second conductivity type in the first well region and a source region of the second conductivity type in the second well region at step 605, wherein the source region and the drain region may have a heavy dopant concentration; forming a first isolation layer atop the semiconductor layer between the source region and the drain region at step 606; and forming a gate atop the first isolation layer above the second well region and an adjacent portion of the first well region at step 607.

In one embodiment, the method of forming the lateral high-voltage transistor may further comprise forming a first dielectric layer covering the source region, the drain region, the first isolation layer and the gate at step 608; and forming a source electrode and a drain electrode at step 609, wherein the source electrode and the drain electrode are respectively coupled to the source region and the drain region.

In one embodiment, the method of forming the lateral high-voltage transistor may further comprise forming a body contact region of the first conductivity type with a heavy dopant concentration adjacent to the source region at the step 605, wherein the body contact region is connected to the source region and coupled to the source electrode. In another embodiment, the method of forming the lateral high-voltage transistor may further comprise forming a body electrode, wherein the body contact region is separated from the source region and is coupled to the body electrode instead of the source electrode.

In one embodiment, the method of forming the lateral high-voltage transistor may further comprise forming a second buried layer of the second conductivity type adjacent to the first buried layer in the semiconductor layer at the step 602, wherein the second buried layer is under the second well region, and is coupled to the first well region, so that the second buried layer and the first well region isolate the second well region from the semiconductor layer.

In one embodiment, forming the first well region at the step 603 may comprise forming a plurality of second-conductivity-type dopant zones, wherein each second-conductivity-type dopant zone has a different dopant concentration from the other second-conductivity-type dopant zones. In one embodiment, the plurality of second-conductivity-type dopant zones may have degrading dopant concentrations in the direction from the dopant zone immediately surrounding the drain region to the dopant zone farthest from the drain region. In one embodiment, the plurality of second-conductivity-type dopant zones may be formed using one or two mask layers. For example, in one embodiment, a first mask layer comprising a plurality of openings having various sizes may be applied for forming the plurality of second-conductivity-type dopant zones so that during an ion implantation step, the mask openings having larger sizes may allow more dopants to enter the semiconductor layer compared to those having smaller sizes. Thus, areas of the semiconductor layer under the mask openings having larger sizes are doped more heavily than areas of the semiconductor layer under the mask openings having smaller sizes. In one embodiment, a single diffusion step (e.g. anneal in a furnace using high temperature) may further be used after the ion implantation step to smooth out the lateral doping profile, yet maintaining a graded lateral doping profile. In another embodiment, in addition to the first mask layer, a second mask layer having a single opening may further be used to introduce a background dopant concentration level that elevates the dopant concentrations of all of the second-conductivity-type dopant zones.

In one embodiment, the method of forming the lateral high-voltage transistor may further comprise forming a spiral resistive field plate atop the first isolation layer between the drain region and the gate at the step 607, wherein the spiral resistive field plate comprises a first end coupled to the source region (e.g. via the source electrode) and a second end coupled to the drain region (e.g. via the drain electrode).

In one embodiment, in order to reduce processing steps and cost, the spiral resistive field plate may be formed using a same layer that is used to form the gate. For example, at the step 607, a lightly-doped or undoped layer of polysilicon may be formed on the first isolation layer, and then may be doped with a first dose of N-type and/or P-type impurities (e.g. boron with a dose in the range of $1 \times 10^{14}$ cm$^{-3}$ to $1 \times 10^{15}$ cm$^{-3}$) to obtain a desired sheet resistance (e.g. 1 to 10 kohms/square) for the spiral resistive field plate. Subsequently, the polysilicon layer may be patterned and etched to form the spiral resistive field plate and the gate, and the gate may then be doped with a second dose of higher concentration of N-type and/or P-type impurities, for example using the source/drain region implant.

In one embodiment, the method of forming the lateral high-voltage transistor may further comprise forming a gate electrode coupled to the gate at the step 609. In one embodiment, the first end of the spiral resistive field plate is coupled to the gate (e.g. via the gate electrode) instead of the source region.

In one embodiment, the method of forming the lateral high-voltage transistor may further comprise forming a thick dielectric layer over a portion of the first well region to laterally isolate the drain region from the gate and the source region at the step 606, wherein the gate formed at the step 607 may have a portion extending on top of the thick dielectric layer, and wherein the spiral resistive field plate is atop the thick dielectric layer instead of the first isolation layer.

Methods and processes of forming a high-voltage transistor described in various embodiments of the present invention are illustrative and not intended to be limiting. Well known manufacturing steps, processes, materials and dopants etc. are not described in detail to avoid obscuring aspects of the technology. Those skilled in the art should understand that the steps described in the embodiments shown may be implemented in different orders and are not limited to the embodiments described.

Although the present disclosure takes an N-channel lateral high-voltage transistor for example to illustrate and explain the structures of a lateral high-voltage transistor according to various embodiments of the present invention, but this is not intended to be limiting and persons of skill in the art will understand that the structures and principles taught herein also apply to P-channel high-voltage transistors and to other types of semiconductor materials and devices as well.

From the foregoing, it will be appreciated that specific embodiments of the technology have been described herein for purposes of illustration, but that various modifications may be made without deviating from the technology. Many of the elements of one embodiment may be combined with other embodiments in addition to or in lieu of the elements of the other embodiments. Accordingly, the technology is not limited except as by the appended claims.

We claim:

1. A lateral high-voltage transistor, comprising:
a semiconductor layer of a first conductivity type;
a source region of a second conductivity type opposite to the first conductivity type in the semiconductor layer;
a drain region of the second conductivity type in the semiconductor layer separated from the source region;
a first isolation layer atop the semiconductor layer between the source region and the drain region;
a first well region of the second conductivity type formed in the semiconductor layer surrounding the drain region, wherein the first well region has an edge extending towards the source region and separated from the source region;
a second well region of the first conductivity type formed in the semiconductor layer surrounding the source region, wherein the second well region has an edge adjacent to the edge of the first well region;
a gate positioned atop the first isolation layer above the second well region and an adjacent portion of the first well region; and
a first buried layer of the first conductivity type formed in the semiconductor layer, and located under a portion of the first well region near the edge of the first well region, wherein the portion of the first well region has a bottom contacting the first buried layer and is overlapped by the gate, and wherein the gate, the portion of the first well region and the first buried layer form a JFET having a pinch-off voltage depending on a length of the first buried layer; a second buried layer of the second conductivity type formed in the semiconductor layer and located under the second well region, wherein the second buried layer physically contacts the first well region.

2. The lateral high-voltage transistor of claim 1, wherein the portion of the first well region between the gate and the first buried layer is configured to be fully depleted by the overlying gate and by the underlying first buried layer when a voltage applied to the drain region exceeds the pinch-off voltage.

3. The lateral high-voltage transistor of claim 2, wherein the pinch-off voltage is lower than a breakdown voltage of the junction formed by the first well region and the second well region.

4. The lateral high-voltage transistor of claim 1 further comprising a body contact region of the first conductivity type in the second well region adjacent to the source region.

5. The lateral high-voltage transistor of claim 1, wherein the first well region and the second buried layer electrically isolate the second well region from the semiconductor layer.

6. The lateral high-voltage transistor of claim 1, wherein the portion of the first well region between the gate and the first buried layer is configured to be fully depleted by the overlying gate and by the underlying first buried layer when a voltage applied to the drain region exceeds the pinch-off voltage, and wherein the pinch-off voltage is lower than a breakdown voltage of the junction formed by the second well region and the second buried layer.

7. The lateral high-voltage transistor of claim 1, wherein the first well region comprises a plurality of second-conductivity-type dopant zones, and wherein each second-conductivity-type dopant zone has a different dopant concentration from the other second-conductivity-type dopant zones.

8. The lateral high-voltage transistor of claim 1 further comprising a thick dielectric layer over a portion of the first well region, wherein the gate comprises a portion extending on top of the thick dielectric layer.

9. The lateral high-voltage transistor of claim 1 further comprising:
a spiral resistive field plate atop the first isolation layer between the drain region and the gate, wherein the spiral resistive field plate comprises a first end coupled to the source region and a second end coupled to the drain region.

10. The lateral high-voltage transistor of claim 9, wherein the first end of the spiral resistive field plate is coupled to the gate instead of the source region.

11. A method of forming a lateral high-voltage transistor comprising:
providing a semiconductor layer of a first conductivity type;
forming a first buried layer of the first conductivity type in the semiconductor layer, wherein the first buried layer has a length;
forming a first well region of a second conductivity type opposite to the first conductivity type in the semiconductor layer, wherein the first well region has a portion having a bottom contacting the first buried layer near an edge of the first well region;
forming a second well region of the first conductivity type in the semiconductor layer, wherein an edge of the second well region is adjacent to the edge of the first well region near the first buried layer;
forming a drain region of the second conductivity type in the first well region;
forming a source region of the second conductivity type in the second well region;
forming a first isolation layer atop the semiconductor layer between the source region and the drain region; and
forming a gate atop the first isolation layer above the second well region, wherein the gate extends laterally to overlie the portion of the first well region contacting the first buried layer so that the gate, the portion of the first well region and the first buried layer form a JFET having a pinch-off voltage depending on the length of the first buried layer; forming a second buried layer of the second conductivity type adjacent to the first buried layer in the semiconductor layer, wherein the second buried layer is under the second well region, and wherein the second buried layer physically contacts the first well region to electrically isolate the second well region from the semiconductor layer.

12. The method of claim 11 further comprising forming a body contact region of the first conductivity type adjacent to the source region.

13. The method of claim 11, wherein forming the first well region comprises forming a plurality of second-conductivity-type dopant zones, wherein each second-conductivity-type dopant zone has a different dopant concentration from the other second-conductivity-type dopant zones.

14. The method of claim 11 further comprising:
forming a spiral resistive field plate atop the first isolation layer between the drain region and the gate, wherein the spiral resistive field plate comprises a first end coupled to the source region and a second end coupled to the drain region.

15. The method of claim 11 further comprising:
forming a spiral resistive field plate atop the first isolation layer between the drain region and the gate, wherein the spiral resistive field plate comprises a first end coupled to the gate and a second end coupled to the drain region.

16. The method of claim 11 further comprising:
forming a thick dielectric layer over a portion of the first well region, wherein the gate has a portion extending on top of the thick dielectric layer.

17. The method of claim 16 further comprising:
forming a spiral resistive field plate atop the thick dielectric layer between the drain region and the gate instead of atop the first isolation layer, wherein the spiral resistive field plate comprises a first end coupled to the source region and a second end coupled to the drain region.

* * * * *